United States Patent [19]

Elias et al.

[11] 4,130,455
[45] Dec. 19, 1978

[54] DISSOLUTION OF METALS-UTILIZING $H_2O_2$-$H_2SO_4$-THIOSULFATE ETCHANT

[75] Inventors: Moenes L. Elias; Millard F. Good, both of Canfield, Ohio

[73] Assignee: Dart Industries Inc., Los Angeles, Calif.

[21] Appl. No.: 849,685

[22] Filed: Nov. 8, 1977

[51] Int. Cl.$^2$ ...................... C09K 13/06; C23F 1/00
[52] U.S. Cl. ................................ 156/666; 156/664; 252/79.2; 252/79.4; 423/272
[58] Field of Search ............... 156/664, 666; 252/79.2, 252/79.4, 180, 186, 100, 175, 95, 145; 423/41, 27, 584, 272, 508, 510; 75/101 R, 115, 117; 134/3, 41

[56] References Cited

U.S. PATENT DOCUMENTS

| | | | |
|---|---|---|---|
| 3,597,290 | 8/1971 | Naito | 156/666 |
| 3,773,577 | 11/1973 | Shibasaki et al. | 156/666 |
| 3,902,896 | 9/1975 | Borbely et al. | 75/117 |
| 3,959,436 | 5/1976 | Watts | 75/101 R |

OTHER PUBLICATIONS

Litvinenko et al, "Mechanism of Catalytic Oxidation of some Substrates by Hydrogen Peroxide", *Chem. Abstract*, vol. 83 (1975), p. 339.

Korosteleva et al, "Preparation . . . Hydrogen Peroxide–Sodium Thiosulfate", *Chemical Abstract*, vol. 83 (1975) p. 11.

Ohishi et al, "Black Dyeing Agent for Iron", *Chemical Abstract* vol. 80 (1974) p. 157.

*Primary Examiner*—Jerome W. Massie
*Attorney, Agent, or Firm*—Margareta LeMaire; Bryant W. Brennan; Fred S. Valles

[57] ABSTRACT

Improved metal dissolution rates are obtained when using a solution containing sulfuric acid, hydrogen peroxide and a catalytic amount of a thiosulfate of sodium or potassium.

15 Claims, No Drawings

DISSOLUTION OF METALS-UTILIZING $H_2O_2$-$H_2SO_4$-THIOSULFATE ETCHANT

The present invention relates to the dissolution of metals in an aqueous bath containing sulfuric acid and hydrogen peroxide, and in particular to a novel bath composition capable of effecting the dissolution at high rates. In one specific aspect the invention is concerned with etching of copper in the production of printed circuit boards.

BACKGROUND OF THE INVENTION

As is well known in the art, in the manufacture of printed electronic circuits a laminate of copper and etch resistant material, usually plastic, is used. A common method of obtaining the circuits is to mask the desired pattern on the copper surface of the laminate with a protective resist material, which is impervious to the action of an etch solution. In a subsequent etching step, the unprotected areas of the copper are etched away, while the masked areas remain intact and provide the desired circuiting supported by the plastic. The resist material can be a plastic material, an ink or a solder.

In the last few years, the industry has more and more turned to hydrogen peroxide-sulfuric acid systems for etching the electronic circuit boards, due to the low cost of the etching solutions and to the relative ease with which copper values can be recovered from the spent etch solutions.

However, there are many problems connected with the use of hydrogen peroxide as an ingredient in the etchants. It is a well known fact that the stability of hydrogen peroxide in a sulfuric acid-hydrogen peroxide solution is detrimentally affected by the presence of heavy metal ions such as copper ions. Thus, as etching proceeds and copper ion content of the etchant thereby increases, the etch rate will experience a serious drop-off due to the decomposition of the hydrogen peroxide in the etch bath, which will soon be exhausted. In order to improve the capacity of these etchants, various stabilizers have been suggested and used with some success for abatement of the hydrogen peroxide decomposition due to the presence of copper ions.

Although considerable retardation of the metal ion-induced hydrogen peroxide decomposition can be achieved by the addition of a suitable stabilizer, the etch rates of the stabilized hydrogen peroxide-sulfuric acid etchants have, generally, been quite low and in need of improvement especially at high copper ion concentrations. It has therefore, been suggested in the prior art to add a catalyst or promoter to improve the etch rate. Specific examples of such catalyst are the metal ions disclosed in the U.S. Pat. No. 3,597,290, such as silver, mercury, palladium, gold and platinum ions, which all have a lower oxidation potential than that of copper. Other examples include those of U.S. Pat. No. 3,293,093, i.e. phenacetin, sulfathiazole and silver ion, or the various combinations of any of the above three components with dibasic acids, as disclosed in U.S. Pat. No. 3,341,384, or with the phenyl ureas or benzoic acids of U.S. Pat. No. 3,407,141, or with the urea and thiourea compounds of U.S. Pat. No. 3,668,131.

Another problem often encountered using hydrogen peroxide-sulfuric acid etchants is that etching rates are adversely effected by the presence of even small amounts of chloride or bromide ions, and usually ordinary tap water cannot be used in preparing the etching-solution. It is therefore, required that these ions be removed either by deionization of the water or by precipitation of the contaminating ions, e.g. with silver ions added in the form of a soluble silver salt.

Although silver ions thus appear to provide a universal solution to the above-discussed problem of low etch rates as well as that caused by the presence of free chloride and bromide ion content, there are still some disadvantages had with the use of silver ions in preparing hydrogen peroxide-sulfuric acid etch solutions. One of these is the high cost of silver. Another is that silver ions still do not promote the rate of etching as much as would be desired.

An object of the present invention is therefore to provide a novel, highly efficient aqueous composition for the dissolution of metals.

Another object is to provide an improved method for the dissolution of metals, e.g. copper or alloys of copper, at high rates.

Still another object of the invention is to provide an etching composition and process, which are insensitive to relatively high concentrations of chloride and bromide ions.

Other objects of the invention will become readily apparent from the detailed description set forth hereinafter.

THE INVENTION

In accordance with the present invention there is provided a composition which comprises an aqueous solution of from about 0.2 to about 4.5 gram moles per liter of sulfuric acid, from about 0.25 to about 8 gram moles per liter of hydrogen peroxide and a catalytically effective amount of an additive selected from thiosulfates of sodium or potassium.

Significantly improved metal dissolution rates are obtained when the concentration of the catalyst is maintained at about 2 millimoles per liter and higher. Preferably, the concentration should be in the range from about 5 to about 50 millimoles per liter, although higher values can also be used. There is, however, no particular added advantage in using such excess quantities.

The sulfuric acid concentration of the solution should be maintained between about 0.2 to about 4.5 gram moles per liter and preferably between about 0.3 and about 4 gram moles per liter. The hydrogen peroxide concentration of the solution should broadly be in the range of from about 0.25 to about 8 gram moles per liter and preferably limited to 1 to about 4 gram moles per liter.

The remaining portion of the solution is made up with water which does not need any special pretreatment to remove free chloride and bromide ions to the conventional level of 2 ppm or less. Nor is it necessary to add any compounds such as a soluble silver salt to the solution in order to precipitate the chloride and bromide contaminants otherwise harmful to the etching process. It has been found that the compositions of this invention can contain relatively large amounts of the contaminants, such as 50 ppm and even higher, without any noticeable deleterious effect on etch rates.

The solutions may also contain other various ingredients such as any of the well known stabilizers used for counteracting heavy metal ion induced degradation of hydrogen peroxide. Examples of suitable stabilizers include those disclosed in U.S. Pat. No. 3,537,895; U.S. Pat. No. 3,597,290; U.S. Pat. No. 3,649,194; U.S. Pat. No. 3,801,512 and U.S. Pat. No. 3,945,865. The aforementioned patents are incorporated in this specification by reference. Of course, any of various other compounds having a stabilizing effect on acidified hydrogen-peroxide metal treating solutions can be used with equal advantage.

Also, any of the additives known to prevent undercutting, i.e. side or lateral etching, can also be added, if desired. Examples of such compounds are the nitrogen compounds disclosed in U.S. Pat. Nos. 3,597,290 and 3,773,577, both incorporated in this disclosure by reference. However, in the present invention, the use of such additives is not necessary, because of the rapid etch rates obtained due to inclusion of the thiosulfate catalyst in the etching compositions.

The solutions are particularly useful in the chemical milling and etching of copper and alloys of copper, but other metals and alloys may also be dissolved with the solutions of this invention, e.g. iron, nickel, zinc and steel.

When using the solutions to dissolve a metal, conventional operating conditions for the particular metal are employed. Thus, in the etching of copper usually temperatures between about 105° to about 140° F. should be maintained and preferably the operating temperature should be between about 120° and about 135° F.

The solutions are eminently suited as etchants using either immersion or spray etching techniques. The etch rates obtained with the compositions of the invention are extremely fast, e.g. etch times in the order of about 0.5 to 1 minute are typical when etching copper laminates containing 1 oz. copper per square foot. Because of these unusually high etch rates the compositions are especially attractive as etchants in the manufacture of printed circuit boards, where it is required that a relatively large number of work pieces be processed per unit time for economical reasons as well as for minimizing detrimental lateral etching or undercutting of the edges under the resist material. Another important advantage of the invention is that clean etchings are achieved.

The following examples are provided as illustration of the invention.

EXAMPLES 1 and 2

Etching tests were carried out in a DEA-30 spray etcher with hydrogen peroxide-sulfuric acid etchants. Copper laminates having a coating of one ounce copper per square foot were treated at 125° F. with the etchants. The control etch solution (Example 1) contained 15 percent by volume of 66° Baume sulfuric acid (2.7 gram moles/liter), 12 percent by volume of 55 wt % hydrogen peroxide (2.4 gram moles/liter) and 73 percent by volume of water. In addition, the solution contained 15.75 grams/liter of copper sulfate pentahydrate and 1 gram/liter of sodium phenol sulfonate. The etch time, i.e. the time required to complete etch away the copper from a board was 8 minutes and 35 seconds for the control etch solution of Example 1.

Example 2 was carried out exactly as Example 1 except that to the control etch solution there was added 2.0 grams/liter sodium thiosulfate (12.65 millimoles/liter). The inclusion of the thiosulfate catalyst in the etch solution resulted in a dramatic decrease in etch time from 8 minutes 35 seconds to 35 seconds, i.e. the etch rate was increased about 15 fold.

EXAMPLES 3 and 4

To demonstrate the insensitivity of the compositions of the invention to the presence of chloride ions, the following experiments were carried out. Copper laminates (2" × 2") having a coating of one ounce copper per square foot were immersion etched in stirred solutions (800 ml) maintained at 129° F. Each of the solutions contained 15 volume percent 66° Baume sulfuric acid (2.7 gram moles/liter), 15 volume percent (50% w/w) hydrogen peroxide (2.6 gram moles/liter) and 70 volume percent distilled water. The solutions were stabilized with 2.5 grams/liter sodium phenolsulfonate. The solution of Example 3 also contained 2 g/liter of sodium thiosulfate while that of Example 4 contained 2 g/liter of potassium thiosulfate. The times to completely remove the copper from the bottom of the boards were determined. The experiments were subsequently repeated after addition of 45 ppm of chloride ion to each of the solutions and etch times established. As seen from the comparative data presented in Table 1, no retardation in etch rate could be detected.

TABLE I

| Example | Catalyst | Etch Time -sec- | |
|---|---|---|---|
| | | No Cl⁻ | 45 ppm Cl⁻ |
| 3 | $Na_2S_2O_3$ | 100 | 100 |
| 4 | $K_2S_2O_3$ | 110 | 110 |

It should be noted that consistently superior results are obtained with the solutions of this invention in large scale operations e.g. by spray etching techniques. Specifically, the increase in etch rate as compared to that of a control solution is much more pronounced and also the actual etch times are substantially lower typically in the order of ⅛ to ⅔ of the values obtained using the small scale immersion technique described above.

It is obvious to those skilled in the art that many variations and modifications can be made to the specific embodiments discussed above. All such departures from the foregoing specification are considered within the scope of this invention as defined by this specification and the appended claims. What is claimed is:

1. A method of metal dissolution which comprises contacting a metal with an aqueous solution containing from about 0.2 to about 4.5 gram moles per liter of sulfuric acid, from about 0.25 to about 8 gram moles per liter of hydrogen peroxide and a catalytically effective amount of an additive selected from thiosulfates of sodium or potassium.

2. The method of claim 1, wherein said additive is provided at a concentration of at least about 2 millimoles per liter.

3. The method of claim 1, wherein said additive is provided at a concentration in the range from about 5 to about 50 millimoles per liter.

4. The method of claim 1, wherein the aqueous solution contains sodium phenolsulfonate as a stabilizer to reduce the degrading effect of heavy metal ions on hydrogen peroxide.

5. The method of claim 1, wherein the hydrogen peroxide concentration is maintained between about 1 and about 4 gram moles per liter.

6. The method of claim 1, wherein the sulfuric acid concentration is maintained between about 0.3 and about 4 gram moles per liter.

7. The method of claim 1, wherein the metal is copper or an alloy of copper.

8. The method of claim 1, wherein the dissolution is carried out in the presence of free chloride or bromide ions in excess of 2 ppm.

9. A composition for metal dissolution comprising an aqueous solution of from about 2.0 to about 4.5 gram moles per liter of sulfuric acid, from about 0.25 to about 8 gram moles per liter of hydrogen peroxide and a catalytically effective amount of an additive selected from thiosulfates of sodium or potassium.

10. The composition of claim 9, wherein the additive is provided at a concentration of at least about 2 millimoles per liter.

11. The composition of claim 9, wherein the additive is provided at a concentration in the range from about 5 to about 50 millimoles per liter.

12. The composition of claim 9 additionally containing sodium phenolsulfonate as a stabilizer for reducing the degrading effect of heavy metal ions on hydrogen peroxide.

13. The composition of claim 9, wherein the hydrogen peroxide concentration is maintained between about 1 and about 4 gram moles per liter.

14. The composition of claim 9, wherein the sulfuric acid concentration is maintained between about 0.3 and about 4 gram moles per liter.

15. The composition of claim 9 containing more than 2 ppm of free chloride or bromide ions.

* * * * *